United States Patent
Inohara

(10) Patent No.: US 8,252,692 B2
(45) Date of Patent: Aug. 28, 2012

(54) SEMICONDUCTOR DEVICE AND METHOD OF FABRICATING THE SAME

(75) Inventor: Masahiro Inohara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/169,140

(22) Filed: Jun. 27, 2011

(65) Prior Publication Data

US 2011/0256703 A1    Oct. 20, 2011

Related U.S. Application Data

(62) Division of application No. 12/492,167, filed on Jun. 26, 2009, now Pat. No. 7,994,641.

(30) Foreign Application Priority Data

Jun. 26, 2008    (JP) ................... 2008-166876

(51) Int. Cl.
  *H01L 29/72* (2006.01)
(52) U.S. Cl. ........ 438/696; 438/637; 438/639; 438/643; 438/703
(58) Field of Classification Search .................. 438/637, 438/639, 643, 696, 703
  See application file for complete search history.

(56) References Cited

U.S. PATENT DOCUMENTS

| | | | |
|---|---|---|---|
| 6,686,286 B2 * | 2/2004 | Yoon | 438/696 |
| 7,262,495 B2 | 8/2007 | Chen et al. | |
| 2003/0116857 A1 | 6/2003 | Taniguchi et al. | |
| 2004/0021139 A1 | 2/2004 | Jackson et al. | |
| 2004/0227208 A1 * | 11/2004 | Lee et al. | 257/510 |
| 2006/0055050 A1 | 3/2006 | Numata et al. | |
| 2008/0164573 A1 * | 7/2008 | Basker et al. | 257/621 |
| 2008/0233710 A1 | 9/2008 | Hsu et al. | |
| 2009/0001591 A1 * | 1/2009 | Haverty et al. | 257/762 |

FOREIGN PATENT DOCUMENTS

JP    2003-198069    7/2003

OTHER PUBLICATIONS

U.S. Office Action mailed Oct. 12, 2010 corresponding to U.S. Appl. No. 12/492,167, filed Jun. 26, 2009.

* cited by examiner

*Primary Examiner* — Edward Wojciechowicz
(74) *Attorney, Agent, or Firm* — Turocy & Watson, LLP

(57) ABSTRACT

A semiconductor device according to one embodiment includes: a substrate having an element region where a semiconductor element is formed; a via hole formed in a portion of the substrate adjacent to the element region; a conducting portion provided in the via hole via an insulating layer; and a buffer layer provided between the substrate and the insulating layer, wherein the buffer layer is made of a material in which a difference in thermal expansion coefficient between the substrate and the buffer layer is smaller than that between the substrate and the insulating layer.

10 Claims, 13 Drawing Sheets

SEMICONDUCTOR DEVICE AND METHOD OF FABRICATING THE SAME

CROSS-REFERENCE TO RELATED APPLICATIONS

This application is a Division of co-pending U.S. patent application Ser. No. 12/492,167, filed on Jun. 26, 2009, the entire contents of which are incorporated herein by reference.

This application is based upon and claims the benefit of priority from prior Japanese Patent Application No. 2008-166876, filed on Jun. 26, 2008, the entire contents of which are incorporated herein by reference.

BACKGROUND

A conventional circuit board having a through-hole is known in which a silicon substrate having a through-hole formed therein, a conductive film formed on an inner wall of the through-hole and an organic resin film formed on at least one surface of the silicon substrate and covering at least a portion of the through-hole are provided. This circuit board is disclosed in JP-A 2003-198069.

BRIEF SUMMARY

One embodiment of the present invention provides a semiconductor device, comprising:
  a substrate having an element region where a semiconductor element is formed;
  a via hole formed in a portion of the substrate adjacent to the element region;
  a conducting portion provided in the via hole via an insulating layer; and
  a buffer layer provided between the substrate and the insulating layer,
  wherein the buffer layer comprises a material in that a difference in thermal expansion coefficient between the substrate and the buffer layer is smaller than that between the substrate and the insulating layer.

In addition, another embodiment of the present invention provides a method of fabricating a semiconductor device, comprising:
  forming a via hole in a portion of a substrate adjacent to an element region, the substrate having the element region where a semiconductor element is formed;
  forming a buffer layer on a sidewall of the via hole;
  forming an insulating layer on the buffer layer opposite to the sidewall; and
  filling a hole of the insulating layer opposite to the buffer layer side with a conductive material,
  wherein the buffer layer is formed of a material in that a difference in thermal expansion coefficient between the substrate and the buffer layer is smaller than that between the substrate and the insulating layer.

DETAILED DESCRIPTION

First Embodiment

Figure 1:
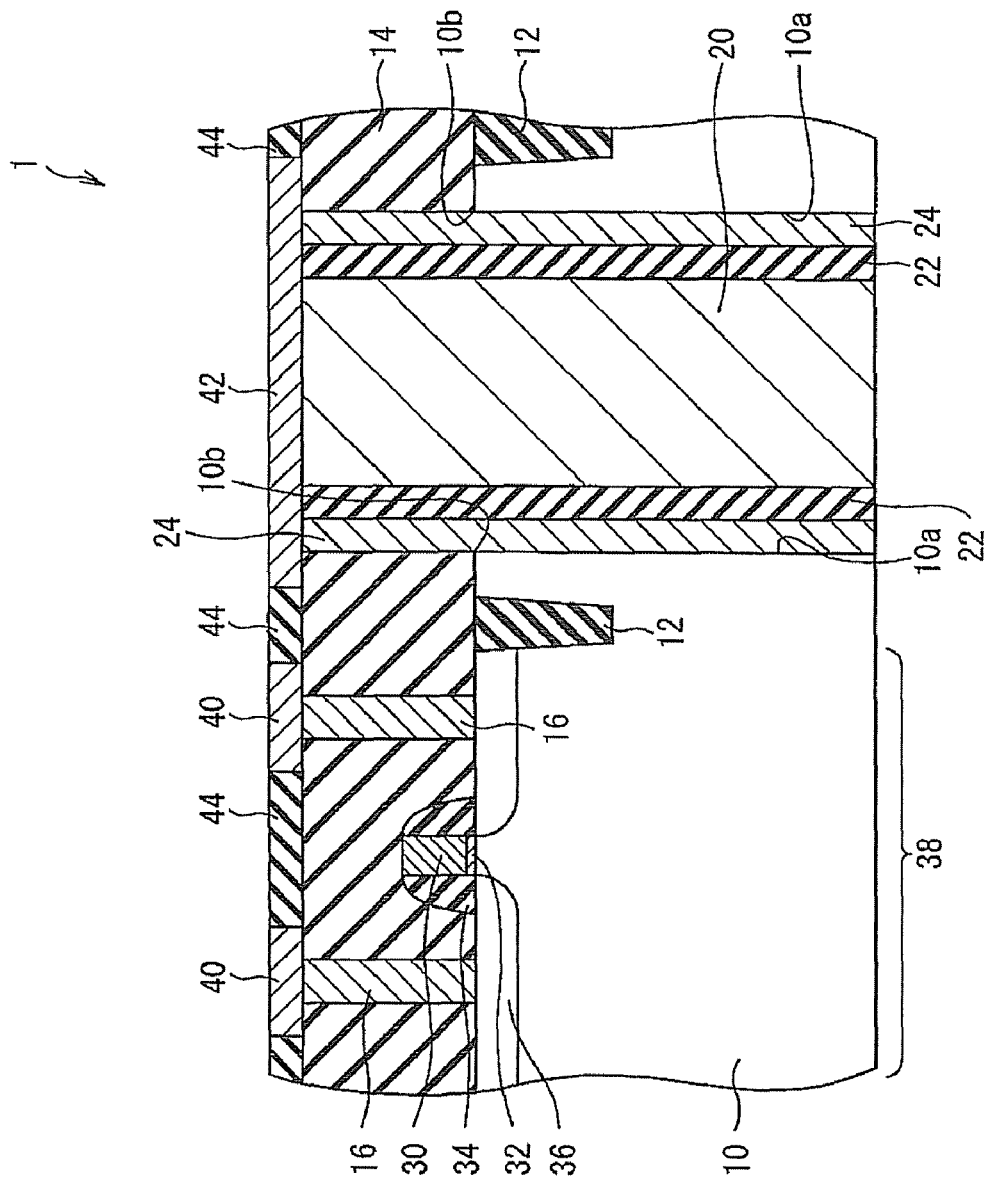
FIG. 1 is a cross sectional view showing a semiconductor device according to a first embodiment.

FIG. 1 shows an example of a cross sectional view of a semiconductor device according to the first embodiment.

A semiconductor device 1 according to the first embodiment includes a substrate 10, an element region 38 in which a semiconductor element such as a transistor (Metal-Insulator-Semiconductor Field Effect Transistor: MISFET), etc., is formed, a via hole formed adjacent to the element region 38 so as to penetrate the substrate 10, a conducting portion 20 provided in the via hole via an insulating layer 22 and having conductivity, and a buffer layer 24 provided between the substrate 10 and the insulating layer 22 for reducing a stress with respect to the substrate 10. Note that, the semiconductor element has, e.g., a gate electrode 30 formed on a surface of the substrate 10 via a gate insulating film 32, gate sidewalls 34 formed on both side faces of the gate insulating film 32 and the gate electrode 30, and source/drain regions 36 formed in predetermined regions in the substrate 10 from the vicinity of a portion immediately under the gate sidewalls 34. Note that, it is possible to form a suicide layer on an upper surface of the gate electrode 30 and on the source/drain regions 36.

Furthermore, the semiconductor device 1 includes an inter-layer insulating film 14 as a surface layer contacting with a surface of the substrate on the side where a semiconductor element is provided and covering the semiconductor element, a wiring 40 formed on the interlayer insulating film 14, a wiring 42 formed at least on the conducting portion 20, an inter-wiring insulating film 44 for electrically insulating between the wirings 40 and between the wiring 40 and the wiring 42, a contact plug 16 formed so as to penetrate the interlayer insulating film 14 for electrically connecting the wiring 40 to the source/drain region 36 in the element region 38, and an element isolation region 12 for electrically isolating between plural semiconductor elements. Note that, the wiring 42 is electrically connected to the conducting portion 20 and can be formed only on the upper surface of the conducting portion 20. In addition, it is possible to form an etching stop layer between the substrate 10 and the interlayer insulating film 14 so as to contact with the surface of the substrate 10.

The substrate 10 is made of a semiconductor material of a predetermined conductivity type and has a predetermined thickness. The substrate 10 is made of, e.g., silicon (Si) having a thermal expansion coefficient of 2.6 ppm/° C. Alternatively, the substrate 10 can be made of silicon germanium (SiGe) or silicon carbide (SiC). The element isolation region 12 is formed having, e.g., a STI (Shallow Trench Isolation) structure, and is made of an insulating material such as silicon dioxide ($SiO_2$), etc.

The interlayer insulating film 14 is made of, e.g., an insulating material such as $SiO_2$, etc., having a thermal expansion coefficient of 0.5 ppm/° C. The interlayer insulating film 14 can be made of silicon oxide such as SiOC which is carbon (C) doped $SiO_2$, SiON which is nitrogen (N) doped $SiO_2$, SiOF which is fluorine (F) doped $SiO_2$ and BPSG which is boron (B)—and phosphorus (P)—doped $SiO_2$, etc., or an organic insulating material such as SiOCH, polymethylsiloxane, polyarylene and benzoxazole, etc. In addition, the inter-wiring insulating film 44 can be made of the same material as the interlayer insulating film 14. Alternatively, the inter-wiring insulating film 44 can be made of a low dielectric insulating material (low-k material) in order to reduce capacitance between the wirings 40 and between the wiring 40 and the wiring 42.

The wiring 40 and the wiring 42 are each made of an electrically conductive material, and are each formed having a predetermined pattern. The wiring 40 and the wiring 42 are each formed containing a metal material such as, e.g., copper (Cu), aluminum (Al), gold (Au), silver (Ag), or tungsten (W), etc. Meanwhile, the contact plug 16 is formed containing a metal material such as, e.g., Cu, Al, Au, Ag, W, molybdenum (Mo), zinc (Zn), cobalt (Co), nickel (Ni), rhodium (Rh) or iron (Fe), etc.

The gate electrode 30 is made of, e.g., polycrystalline silicon or polycrystalline silicon germanium containing an impurity of a predetermined conductivity type. For example, when the semiconductor element is a FET, the gate electrode 30 in an n-type FET contains an n-type impurity such as arsenic (As) or P, etc., as an impurity. On the other hand, the gate electrode 30 in a p-type FET contains a p-type impurity such as B or boron difluoride ($BF_2$), etc.

Alternatively, the gate electrode 30 may be formed of a metal gate electrode made of a metal material such as W, tantalum (Ta), titanium (Ti), hafnium (Hf), zirconium (Zr), ruthenium (Ru), platinum (Pt), iridium (Ir), Mo or Al, etc., or a compound thereof, etc.

The gate insulating film 32 is made of, e.g., an insulating material such as $SiO_2$, silicon nitride (SiN), SiON or a high-dielectric material (e.g., an Hf-based material such as HfSiON, HfSiO or HfO, etc., a Zr-based material such as ZrSiON, ZrSiO or ZrO, etc., and a Y-based material such as $Y_2O_3$, etc.). Meanwhile, the gate sidewall 34 is made of, e.g., an insulating material such as SiN, etc. Note that, when a silicide layer is formed, the silicide layer is made of, e.g., a compound of a metal such as Ni, Pt, Co, Erbium (Er), yttrium (Y), ytterbium (Yb), Ti, NiPt or CoNi, etc., with silicon.

The conducting portion 20 provided in the via hole has a section size which is determined in accordance with a thickness of the substrate 10. For example, when the cross section of the conducting portion 20 is formed in a circular shape, the diameter thereof is formed, e.g., about from 1 to 20 μm. The conducting portion 20 is made of, e.g., a metal material such as Cu having a thermal expansion coefficient of 16.5 ppm/° C. or Al having a thermal expansion coefficient of 23.1 ppm/° C., etc., or tungsten, silicon or the like.

The insulating layer 22 is made of an insulating material which electrically insulates the substrate 10 from the conducting portion 20. The insulating layer 22 is made of, e.g., $SiO_2$ having a thermal expansion coefficient of 0.5 ppm/° C.

The buffer layer 24 restrains a stress generated by a difference between the thermal expansion coefficient of the substrate 10 and that of the conducting portion 20 from concentrating between the substrate 10 and the buffer layer 24. In other words, since the buffer layer 24 made of a material having a predetermined thermal expansion coefficient is provided between the substrate 10 and the insulating layer 22, a stress generated by a difference between the thermal expansion coefficient of the substrate 10 and that of the insulating layer 22 and the conducting portion 20 is substantially concentrated at an interface not between the substrate 10 and the buffer layer 24 but between the insulating layer 22 and the buffer layer 24 by the buffer layer 24.

Concretely, the buffer layer 24 is made of a material in which a difference in thermal expansion coefficient between the substrate 10 and the buffer layer 24 is smaller than that between the substrate 10 and the insulating layer 22. Here, the difference in thermal expansion coefficient between the substrate 10 and the buffer layer 24 indicates an absolute value. More concretely, the buffer layer 24 is made of a material having a thermal expansion coefficient closer to that of the substrate 10 than that of the insulating layer 22.

For example, when the substrate 10 is made of Si (thermal expansion coefficient of 2.6 ppm/° C.) and the insulating layer 22 is made of $SiO_2$ (thermal expansion coefficient of 0.5 ppm/° C.), the buffer layer 24 can be made of carbon (C) having a thermal expansion coefficient of 3.1 ppm/° C. In addition, the buffer layer 24 is made of a material such as silicon nitride (SiN) having a thermal expansion coefficient of 3.1 ppm/° C., tungsten carbide (W—C) having a thermal expansion coefficient of 3.7 ppm/° C., or polyimide having a thermal expansion coefficient adjusted to about 3 ppm/° C., etc. Note that, although electric resistance of the conducting portion 20 increases since a cross-sectional area of the conducting portion 20 decreases due to the increase in the thickness of the buffer layer 24, inductance of the semiconductor device 1 decreases. Therefore, the thickness of the buffer layer 24 is determined in accordance with characteristics required for the semiconductor device 1 according to the present embodiment.

In addition, an interface 10a is formed by contact between the buffer layer 24 and the substrate 10. Since the difference in thermal expansion coefficient between the substrate 10 and the buffer layer 24 is smaller than that between that of the substrate 10 and the interlayer insulating film 14, concentration of the stress at the vicinity of the interface 10a is reduced when heat is applied to the semiconductor device 1. Note that, since surfaces of the buffer layer 24 and the substrate 10 are in contact at the interface 10a, a stress generated in the substrate 10 is partially dispersed at the interface 10a.

Furthermore, the buffer layer 24 includes a predetermined region of a boundary edge 10b between the substrate 10 and an etching stop layer which is made of SiN and is provided on the substrate 10, or a predetermined region of the boundary edge 10b between the substrate 10 and the interlayer insulating film 14. The buffer layer 24 is provided between the boundary edge 10b and the insulating layer 22. In other words, the buffer layer 24 is provided in a region including at least the boundary edge 10b, which is in the via hole, between the interlayer insulating film 14 (or the etching stop layer as a surface layer) and the substrate 10. By providing the buffer layer 24 in the region including at least the boundary edge 10b, it is possible to restrain the stress generated when applying the heat to the semiconductor device 1 from concentrating at the boundary edge 10b.

FIGS. 2A to 5B are cross sectional views showing an example of the processes for fabricating a semiconductor device according to the first embodiment.

Firstly, regions for forming predetermined plural semiconductor elements (e.g., FET) and a via hole are each isolated by forming the element isolation regions 12 in the substrate 10 at predetermined intervals. Subsequently, the gate insulating film 32, the gate electrode 30, the gate sidewalls 34 and the source/drain regions 36 are formed at a predetermined position of the substrate 10 in the element region 38, which results in that a predetermined semiconductor element is formed. Next, the interlayer insulating film 14 as a surface layer is formed by Chemical Vapor Deposition (CVD) method, etc. Note that, it is also possible to form the etching stop layer made of SiN, etc., before forming the interlayer insulating film 14.

Figure 2A:
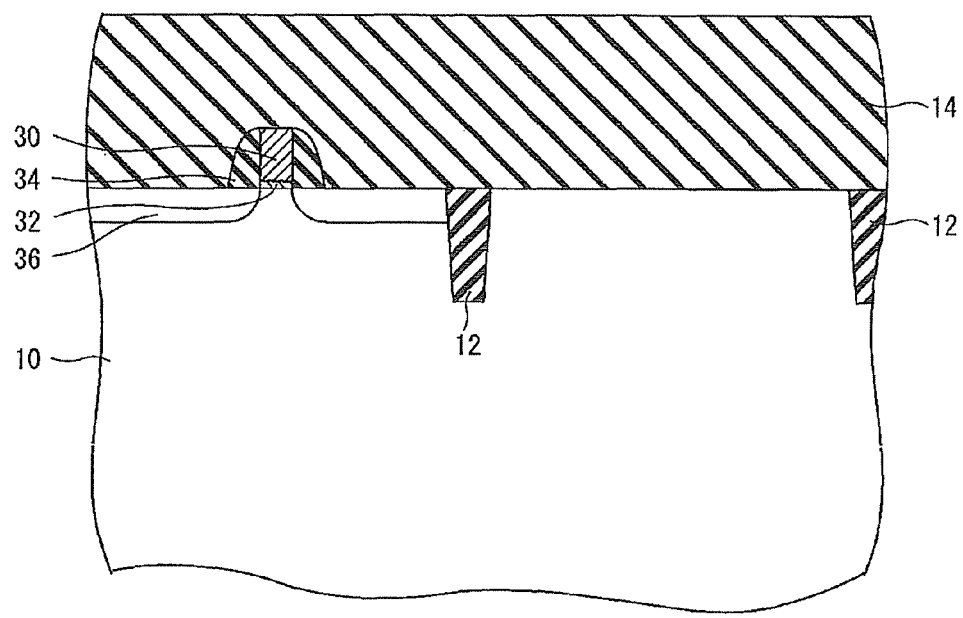
FIG. 2A is a cross sectional view showing a process for fabricating the semiconductor device according to the first embodiment.

Note that, it is possible to form the gate insulating film 32, the gate electrode 30 and the gate sidewalls 34 using a thermal oxidation method, the CVD method and a photolithography method. Meanwhile, when a silicide layer is formed, after forming a predetermined metal film on an upper surface of the gate electrode 30 by a sputtering method, etc., predetermined heat treatment such as a Rapid Thermal Annealing (RTA), etc., is applied to the formed metal film, then, the silicide layer is formed by generating a silicidation reaction between the metal film and the gate electrode 30. A structure shown in FIG. 2A is formed through the above process.

Figure 2B:
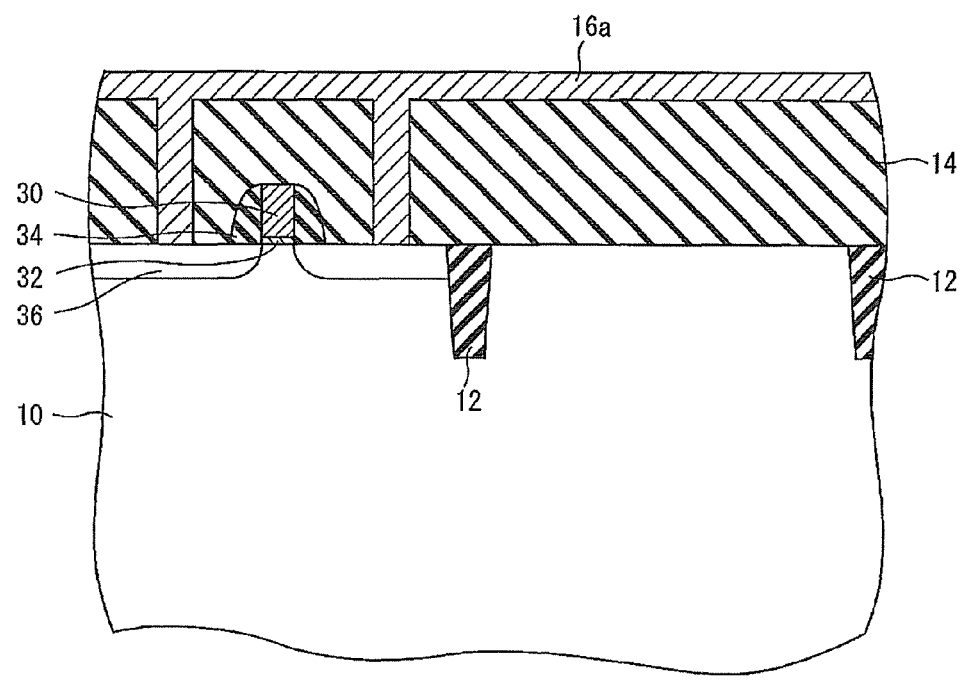
FIG. 2B is a cross sectional view showing a process for fabricating the semiconductor device according to the first embodiment.

Next, as shown in FIG. 2B, after forming a predetermined trench in a predetermined region of the interlayer insulating film 14 using the photolithography method and a Reactive Ion Etching (RIE) method, etc., a plug material film 16a made of a material composing the contact plug 16 is deposited on the interlayer insulating film 14 by the sputtering method, etc., while filling the trench formed on the interlayer insulating film 14 with the plug material film 16a.

Figure 3A:
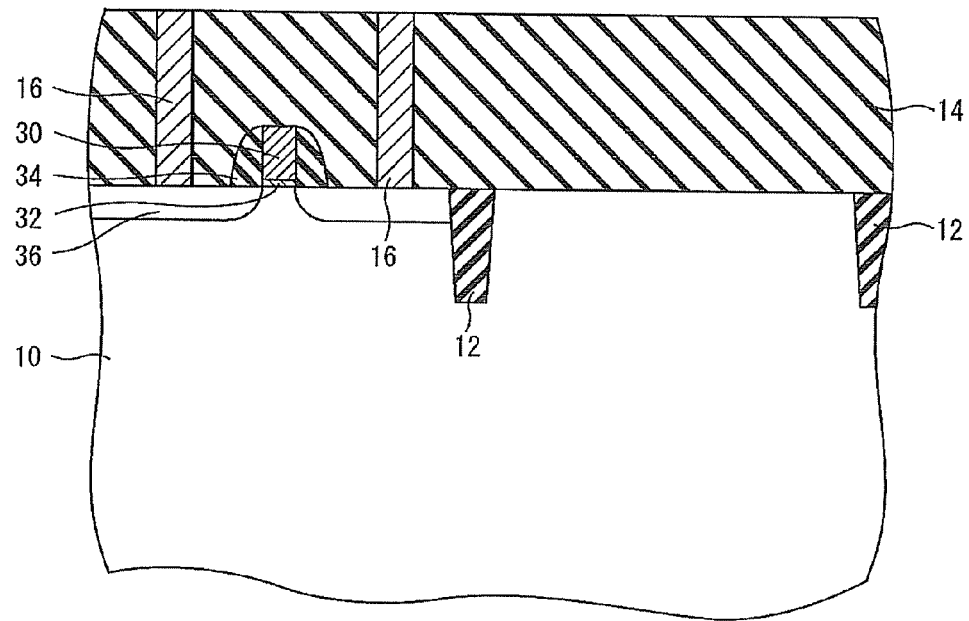
FIG. 3A is a cross sectional view showing a process for fabricating the semiconductor device according to the first embodiment.

Next, as shown in FIG. 3A, the plug material film 16a is planarized by a Chemical Mechanical Polishing (CMP) method, etc., using the upper surface of the interlayer insulating film 14 as a stopper, thereby being shaped into the contact plug 16.

Figure 3B:
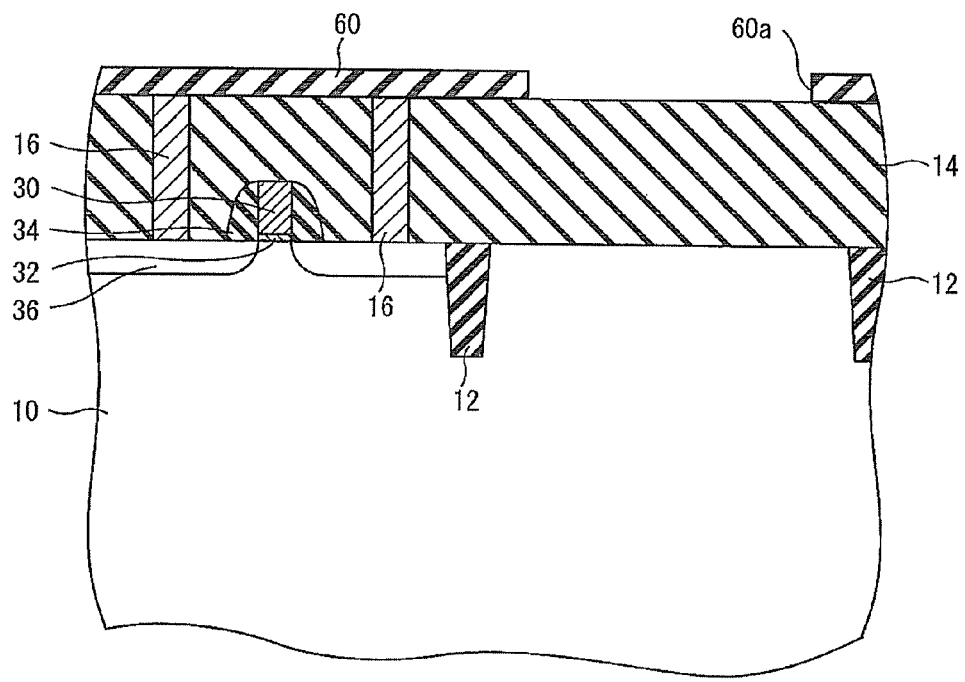
FIG. 3B is a cross sectional view showing a process for fabricating the semiconductor device according to the first embodiment.
Figure 4A:
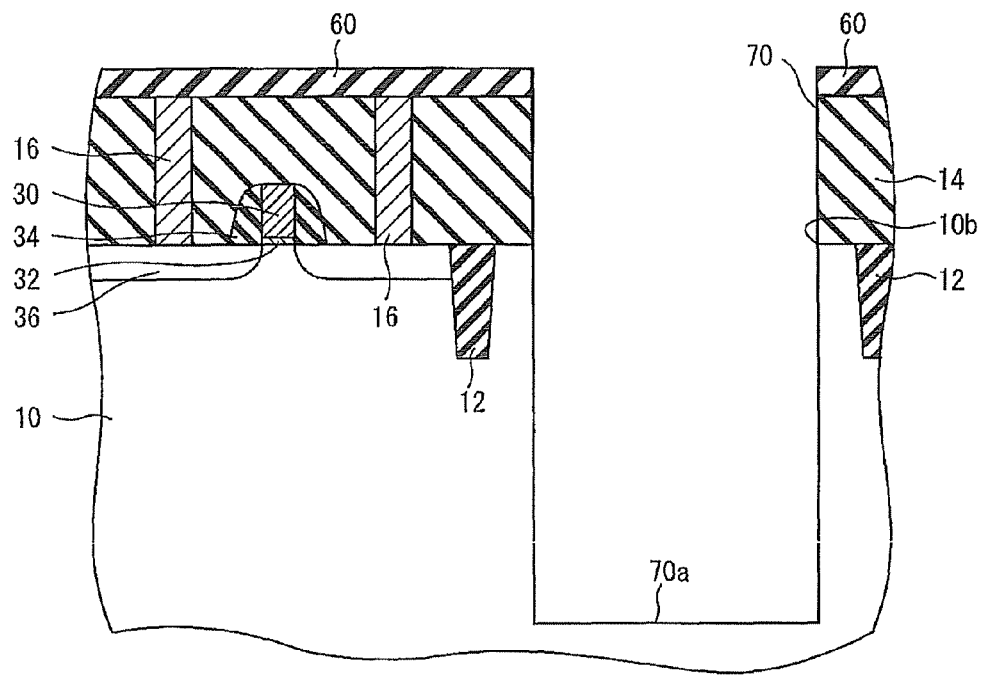
FIG. 4A is a cross sectional view showing a process for fabricating the semiconductor device according to the first embodiment.

Next, as shown in FIG. 3B, a resist pattern 60 having a predetermined shaped opening 60a in a region in which a via hole should be formed is formed on the interlayer insulating film 14 by the photolithography method. Then, as shown in FIG. 4A, an etching process using the RIE method, etc., is applied to the interlayer insulating film 14 and the substrate 10 using the resist pattern 60 as a mask, which results in that a processing hole 70 having a predetermined depth is formed as a portion of the via hole. In this case, the processing hole 70 having a bottom 70a is formed by applying the etching process up to a depth not penetrating the substrate 10. Concretely, the processing hole 70 is formed as a concave portion in a concave shape having a depth deeper than a boundary between the substrate 10 and the interlayer insulating film 14 (or the etching stop layer as a surface layer).

As a result, the boundary edge 10b between the substrate 10 and the interlayer insulating film 14 (or the etching stop layer as a surface layer) is exposed. Note that, in a modification of the first embodiment, it is possible to form a processing hole as a via hole having a through-hole shape by penetrating the substrate 10 by the etching process.

Figure 4B:
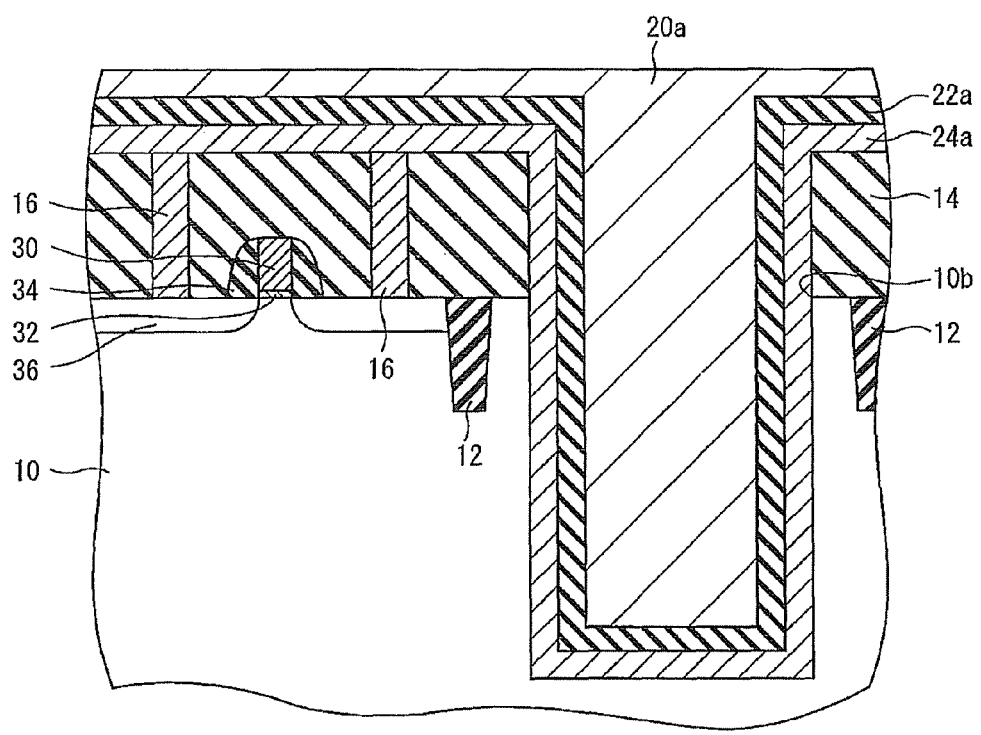
FIG. 4B is a cross sectional view showing a process for fabricating the semiconductor device according to the first embodiment.

Next, as shown in FIG. 4B, after removing the resist pattern 60, a buffer material film 24a made of a material composing the buffer layer 24 is formed having a predetermined thickness on the bottom 70a of the processing hole 70, the side face of the processing hole 70 and the interlayer insulating film 14 by using the CVD method, etc. In this case, the buffer material film 24a is formed so as to cover at least the boundary edge 10b between the substrate 10 and the interlayer insulating film 14 (or the etching stop layer as a surface layer). Subsequently, an insulating material film 22a made of a material composing the insulating layer 22 is formed having a predetermined thickness on a surface of the buffer material film 24a using the CVD method, etc.

Note that, an altered layer, which is the vicinity of the surface of the buffer material film 24a chemically altered by a predetermined gas material used for the CVD method, may be formed between the buffer material film 24a and the insulating material film 22a at the time of forming the insulating material film 22a. In the present embodiment, the unavoidably formed altered layer is not excluded.

Furthermore, a conductive material 20a made of a material composing the conducting portion 20 is formed on the surface of the insulating material film 22a using a plating method, etc. In this case, the conductive material 20a is formed by filling up the processing hole 70. Note that, in the modification of the first embodiment, it is possible to form the buffer material film 24a, the insulating material film 22a and the conductive material 20a while leaving the resist pattern 60. In addition, in the modification of the first embodiment, in order to suppress generation of a void in the conductive material 20a, plating process can be applied to the inside of the processing hole while flowing a plating solution thereinto by forming processing hole as a via hole penetrating through the substrate 10.

Figure 5A:
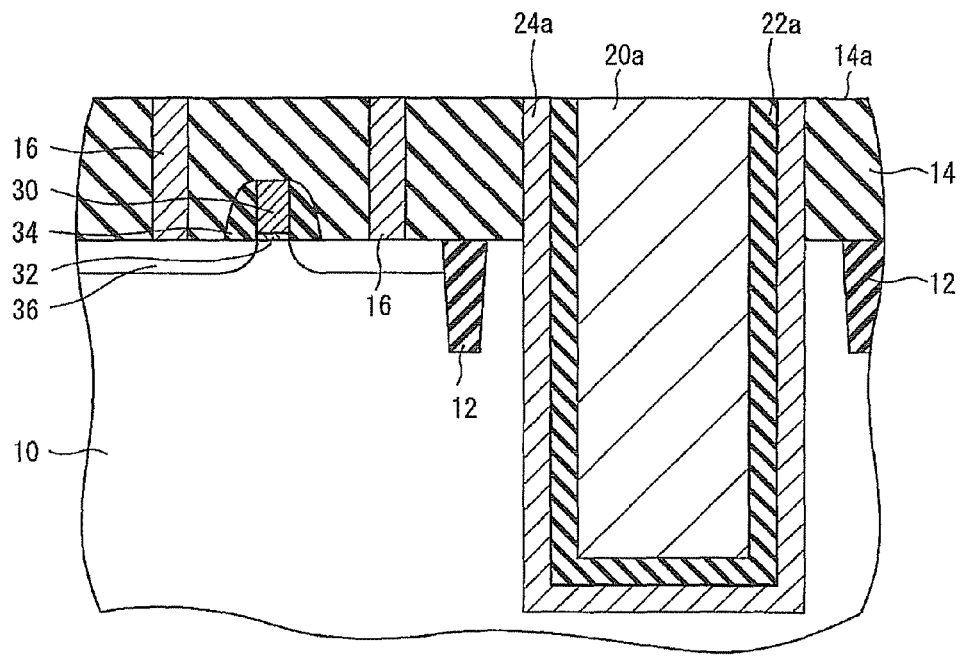
FIG. 5A is a cross sectional view showing a process for fabricating the semiconductor device according to the first embodiment.

Next, as shown in FIG. 5A, the buffer material film 24a, the insulating material film 22a and the conductive material 20a are planarized by the CMP method, etc., using the upper surface of the interlayer insulating film 14 as a stopper. As a result, the buffer material film 24a, the insulating material film 22a and the conductive material 20a other than the portions thereof formed in the processing hole 70 are removed, thereby forming a polished surface 14a.

Following this, the inter-wiring insulating film 44 is formed on the polished surface 14a using the CVD method, etc. Then, after forming wiring trenches in a predetermined region of the inter-wiring insulating film 44 by using the photolithography method and the RIE method, etc., a material composing the wirings 40 and 42 is formed at least in the wiring trenches by the sputtering method, etc. Next, the wirings 40 and 42 each electrically isolated by the inter-wiring insulating film 44 are each formed by applying the planarizing treatment such as the CMP method, etc., to a film made of a material composing the wirings 40 and 42 formed on the polished surface 14a side.

Figure 5B:
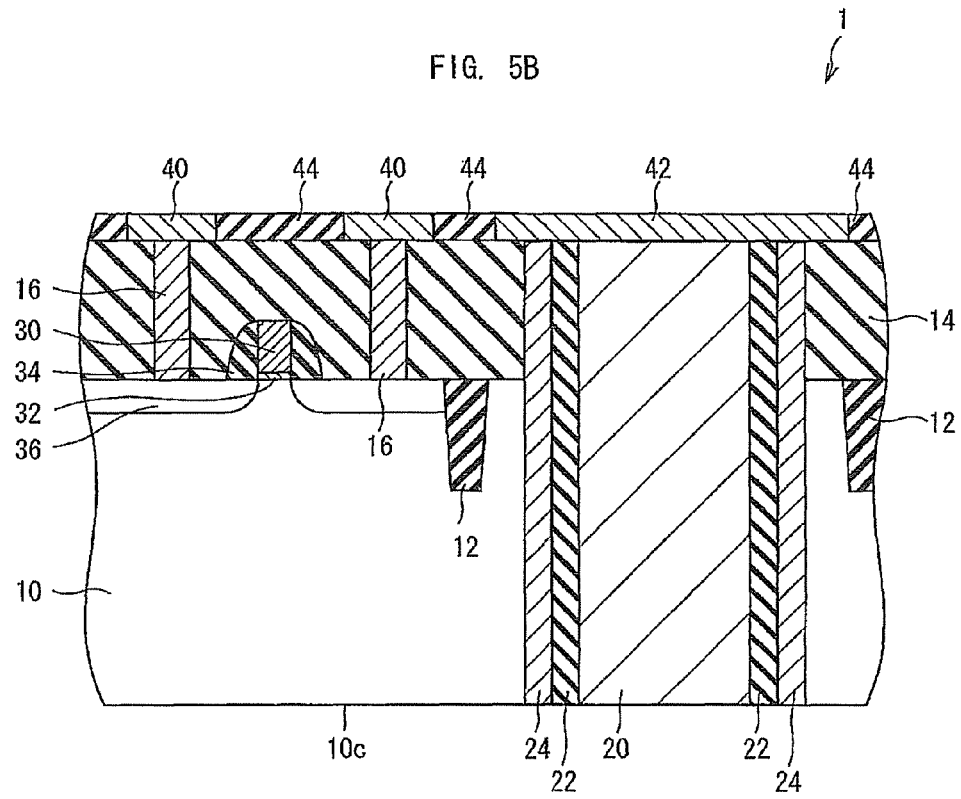
FIG. 5B is a cross sectional view showing a process for fabricating the semiconductor device according to the first embodiment.

Then, by applying grinding and/or polishing process to a back surface of the substrate 10, the substrate 10 is thinned up to a predetermined thickness and a polished surface 10c is formed, which results in that the conducting portion 20, the insulating layer 22 and the buffer layer 24 are formed. As a result, the semiconductor device 1 according to the first embodiment as shown in FIG. 5B is obtained.

According to the first embodiment, since the buffer layer 24 made of a material in which the difference in thermal expansion coefficient between the substrate 10 and the buffer layer 24 is smaller than that between the substrate 10 and the insulating layer 22 is formed between the substrate 10 and the insulating layer 22, it is possible to reduce concentration of the stress at the interface 10a in case that heat is applied to the semiconductor device 1. As a result, even in the case that predetermined heat is repeatedly applied to the semiconductor device 1 according to the present embodiment, the stress transmitted to the substrate 10 side is reduced, the generation of crystal defects in the substrate 10 can be suppressed, and it is thereby possible to provide the semiconductor device 1 with high reliability.

Note that, it is possible to apply the semiconductor device 1 of the present embodiment to, e.g., SiP (System-in-a-Package) in which plural semiconductor devices 1 are laminated and each semiconductor device 1 is electrically connected by the conducting portion 20.

Second Embodiment

FIGS. 6A to 10 are cross sectional views showing an example of the processes for fabricating a semiconductor device according to the second embodiment.

The second embodiment provides the substantially same processes as the method of fabricating the semiconductor device 1 according to the first embodiment, except that the process of thinning the substrate 10 is performed prior to the process of forming the conducting portion 20, etc. Therefore, detailed explanations will be omitted for the processes substantially same as the first embodiment.

Firstly, a structure provided with the contact plug 16 as shown in FIG. 3A is formed through the same processes as the processes described in the method of fabricating the semiconductor device 1 according to the first embodiment in FIGS. 2A to 3A.

Figure 6A:
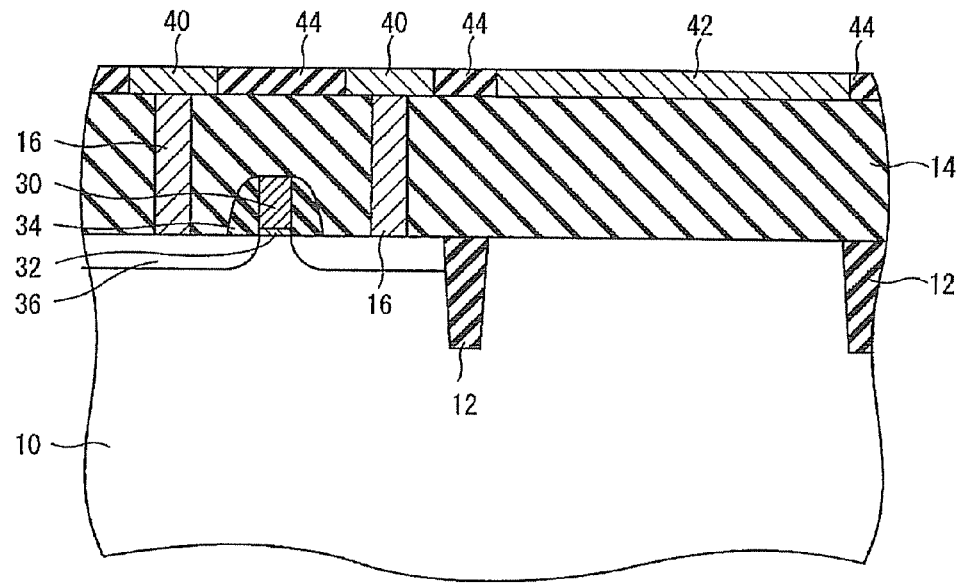
FIG. 6A is a cross sectional view showing a process for fabricating the semiconductor device according to a second embodiment.
Figure 6B:
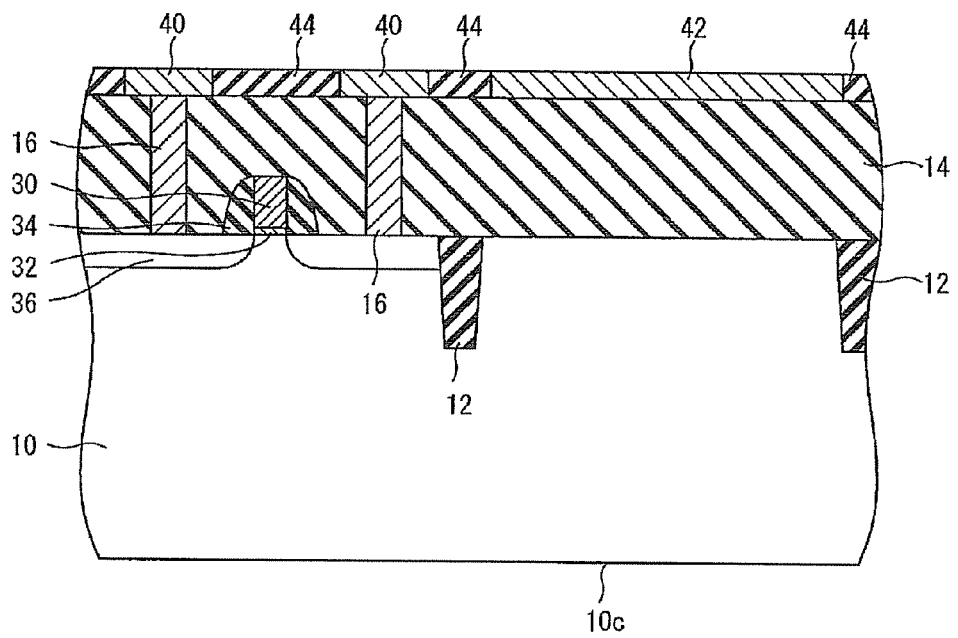
FIG. 6B is a cross sectional view showing a process for fabricating the semiconductor device according to the second embodiment.

Then, as shown in FIG. 6A, the wirings 40 and the wiring 42 each electrically segregated by the inter-wiring insulating film 44 are each formed using the CVD method, the photolithography method, the RIE method and the sputtering method, etc. In this case, the wiring 40 is formed in a region electrically connected to the contact plug 16, and the wiring 42 is formed in a predetermined region on the interlayer insulating film 14 corresponding to a region in which at least the conducting portion 20 should be formed. Next, as shown in FIG. 6B, the substrate 10 is thinned by applying grinding and/or polishing process to a back surface of the substrate 10 up to a predetermined thickness, which results in that a polished surface 10c is formed.

Figure 7A:
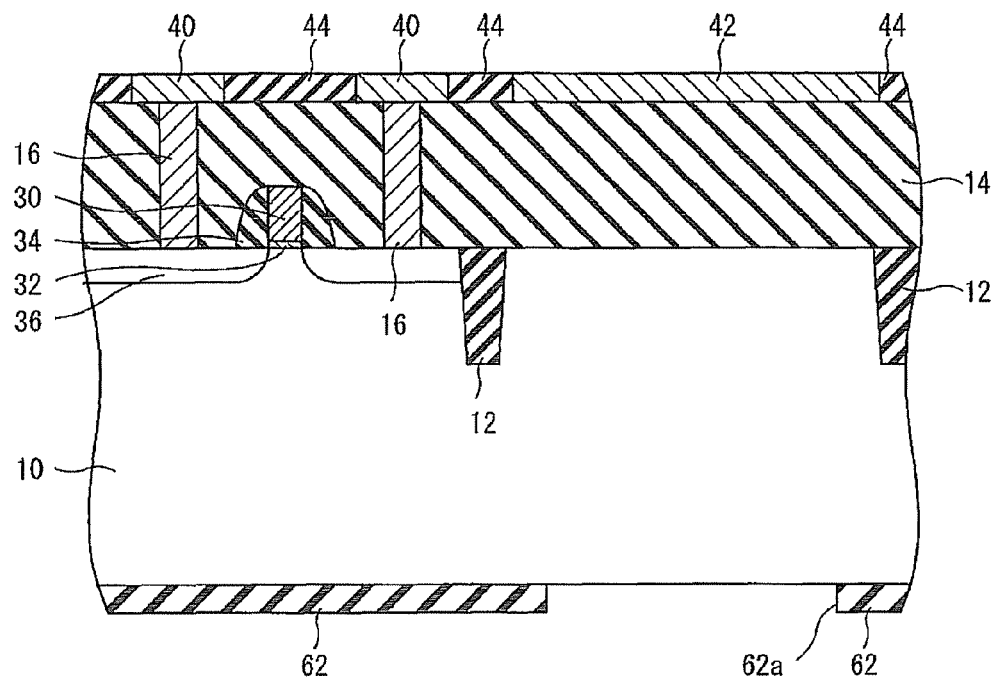
FIG. 7A is a cross sectional view showing a process for fabricating the semiconductor device according to the second embodiment.
Figure 7B:
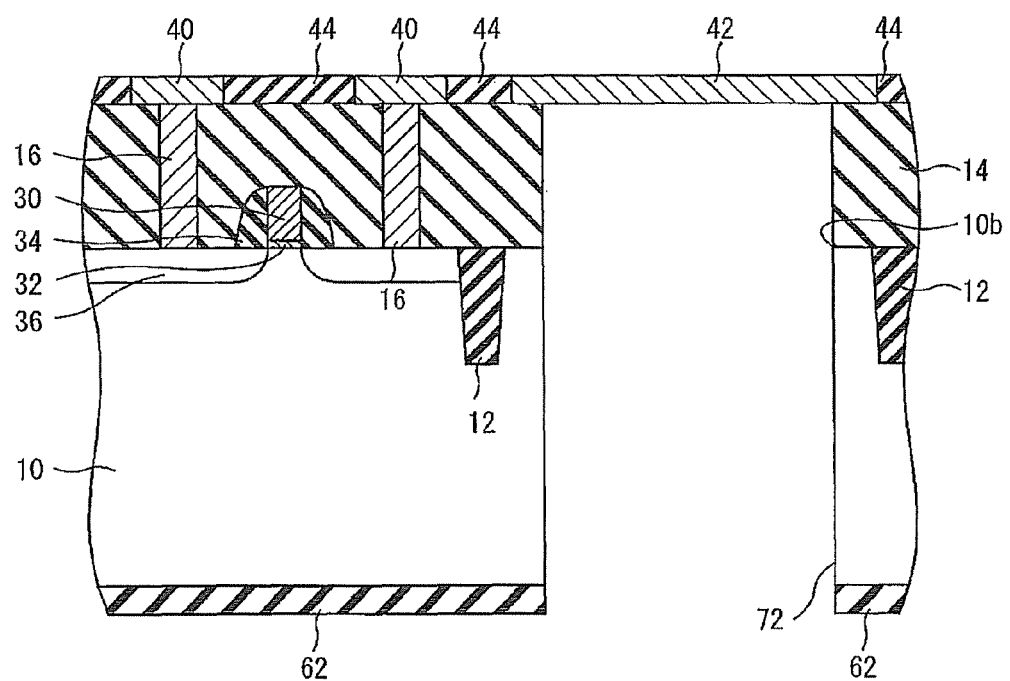
FIG. 7B is a cross sectional view showing a process for fabricating the semiconductor device according to the second embodiment.

Next, as shown in FIG. 7A, a resist pattern 62 having a predetermined shaped opening 62a in a region in which a via hole should be formed is formed on a surface of the polished surface 10c by the photolithography method, etc. Then, as shown in FIG. 7B, an etching process using the RIE method, etc., is applied to the substrate 10 and the interlayer insulating film 14 using the resist pattern 62 as a mask, which results in that a processing hole 72 as a via hole is formed. As a result, the boundary edge 10b between the substrate 10 and the interlayer insulating film 14 (or the etching stop layer as a surface layer) is exposed. In this case, the etching process is terminated at a stage that the surface of the wiring 42 on the side in contact with the interlayer insulating film 14 (or the etching stop layer as a surface layer) is exposed. Note that, in a modification of the second embodiment, it is possible to form a processing hole as a through-hole by removing the region of the wiring 42 corresponding to the processing hole 72.

Figure 8A:
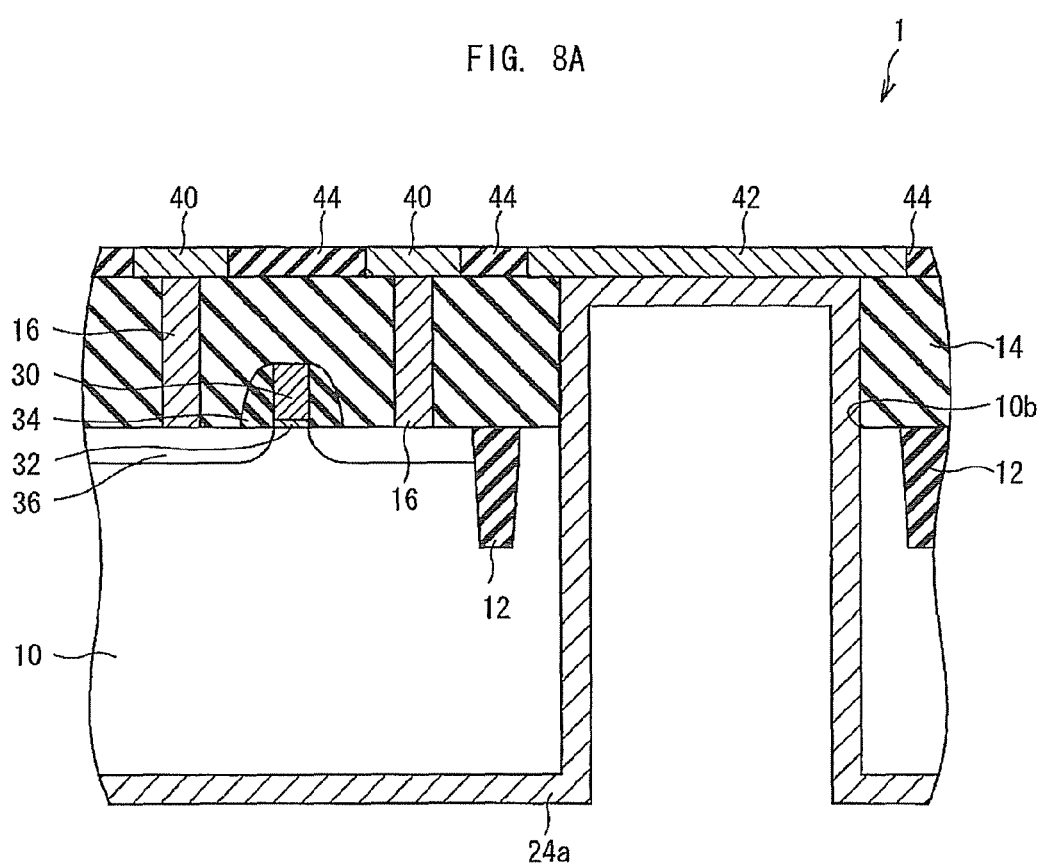
FIG. 8A is a cross sectional view showing a process for fabricating the semiconductor device according to the second embodiment.

Next, as shown in FIG. 8A, the buffer material film 24a made of a material composing the buffer layer 24 is formed having a predetermined thickness on the side face of the processing hole 72, the exposed region of the wiring 42 and the polished surface 10c of the substrate 10 by using the CVD method, etc. In this case, the buffer material film 24a is formed so as to cover at least the boundary edge 10b between the substrate 10 and the interlayer insulating film 14 (or the etching stop layer as a surface layer).

Figure 8B:
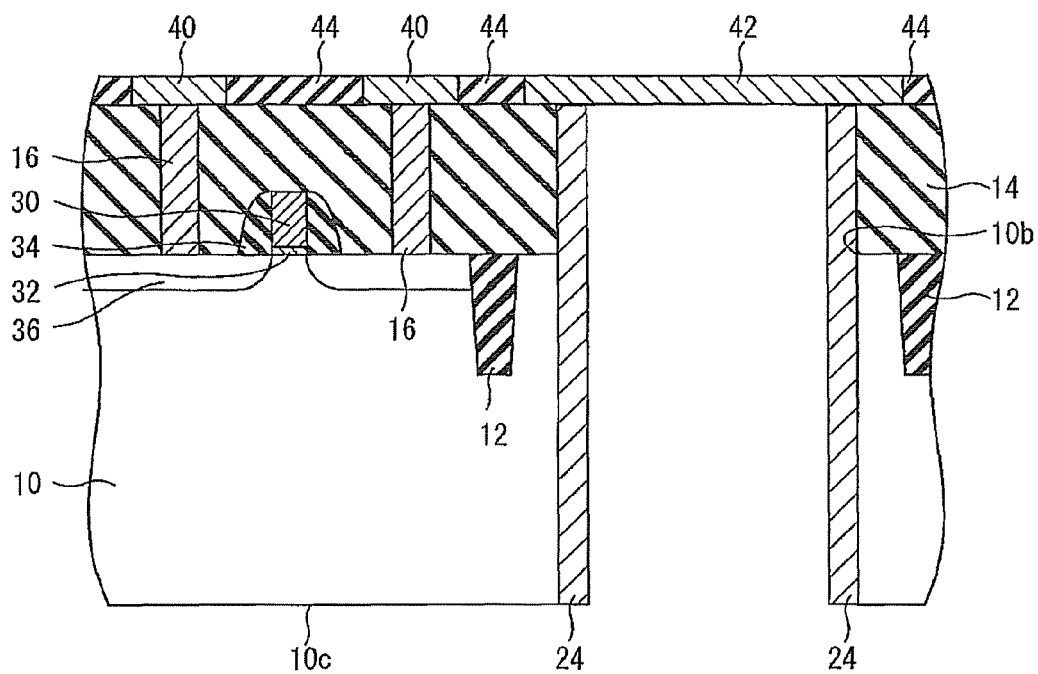
FIG. 8B is a cross sectional view showing a process for fabricating the semiconductor device according to the second embodiment.

Then, as shown in FIG. 8B, the buffer layer 24 is formed by applying an anisotropic etching process using the RIE method, etc., while leaving the buffer material film 24a formed on the side faces of the substrate 10 and the interlayer insulating film 14 which are exposed by the processing hole 72.

Figure 9A:
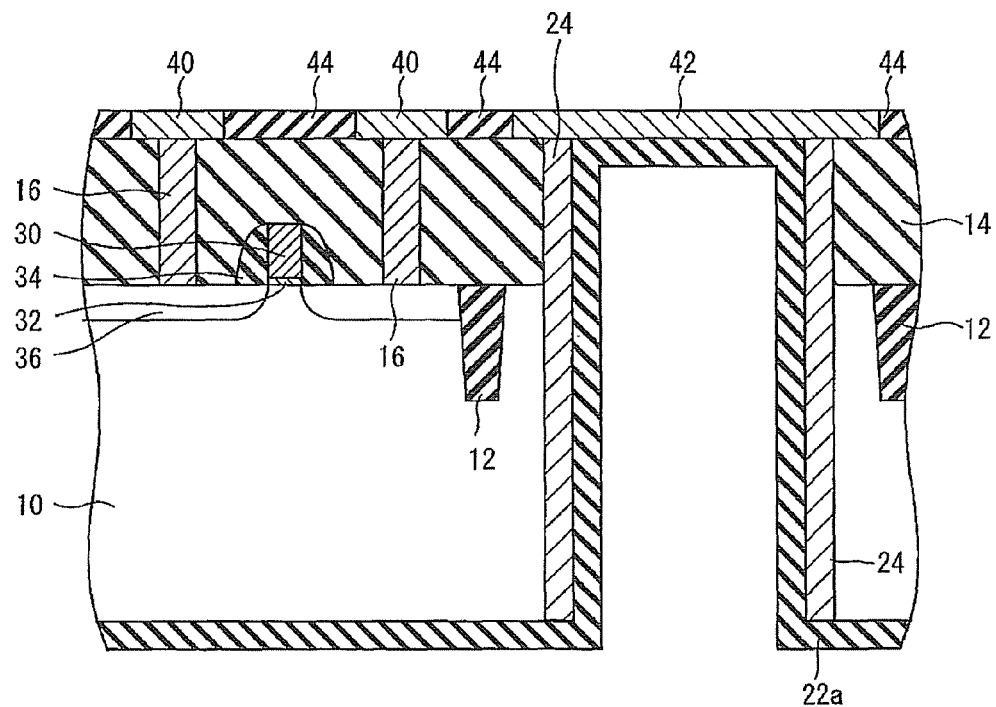
FIG. 9A is a cross sectional view showing a process for fabricating the semiconductor device according to the second embodiment.
Figure 9B:
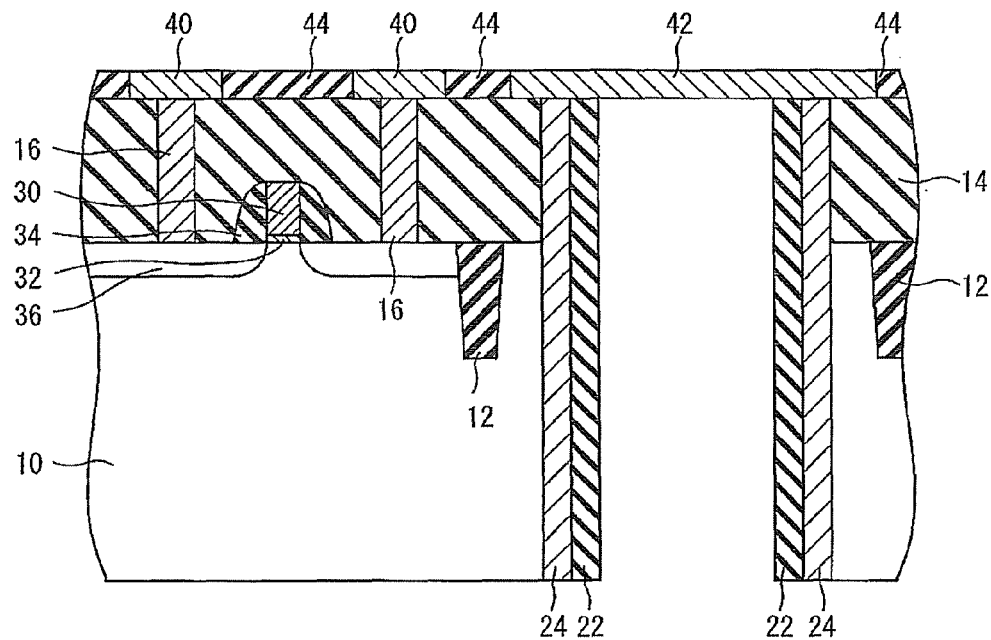
FIG. 9B is a cross sectional view showing a process for fabricating the semiconductor device according to the second embodiment.

Next, as shown in FIG. 9A, the insulating material film 22a made of a material composing the insulating layer 22 is formed having a predetermined thickness on the surface of the buffer layer 24, the exposed region of the wiring 42, and the polished surface 10c of the substrate 10 using the CVD method, etc. Then, as shown in FIG. 9B, the insulating layer 22 is formed by applying an anisotropic etching process using the RIE method, etc., while leaving the insulating material film 22a formed on the surface of the buffer layer 24.

Figure 10:
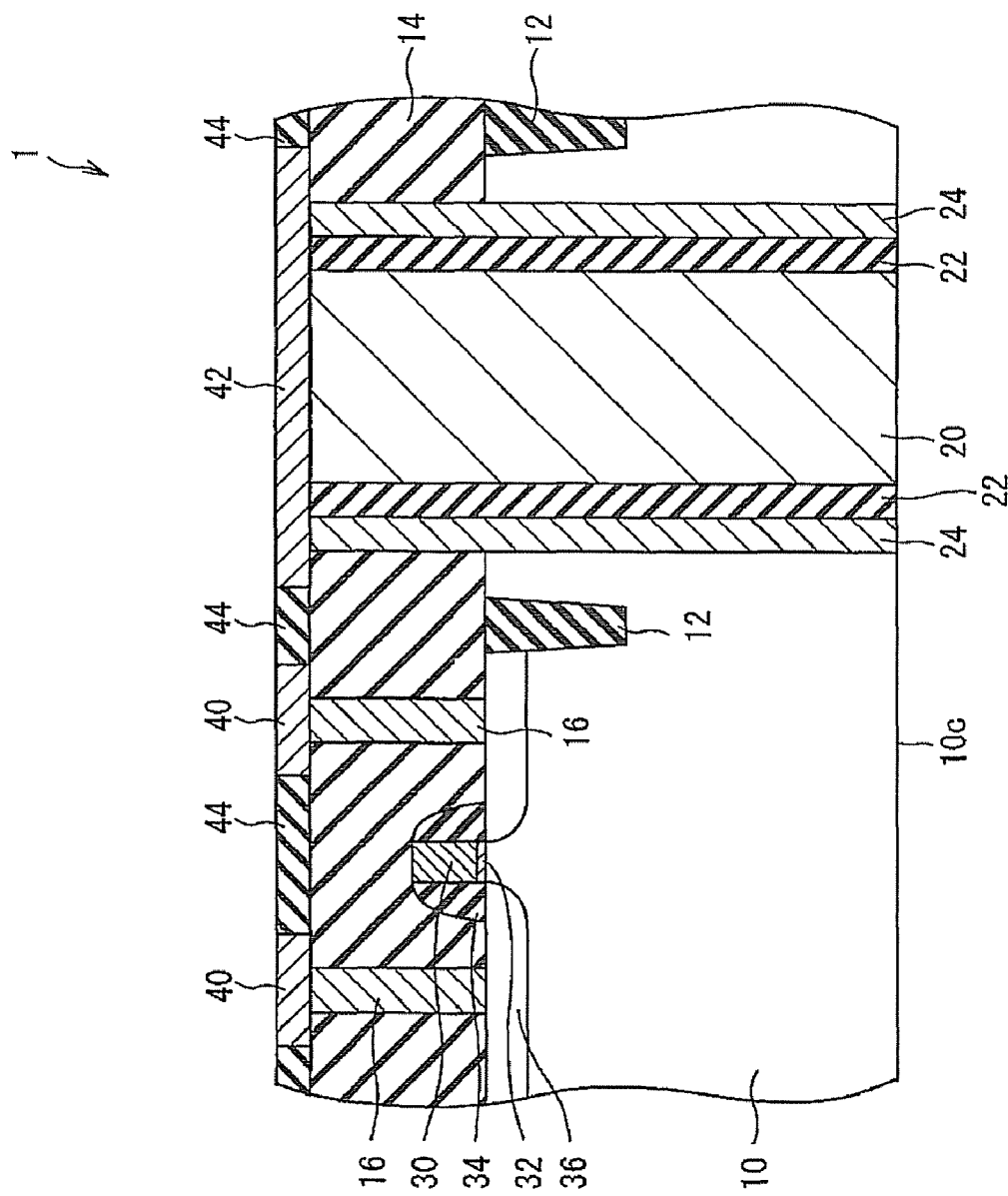
FIG. 10 is a cross sectional view showing a process for fabricating the semiconductor device according to the second embodiment.

Next, the processing hole 72 having the insulating layer 22 and the buffer layer 24 formed therein are filled with a conductive material 20a by using a plating method, etc., and planarizing treatment is applied by the CMP method, etc., using the polished surface 10c of the substrate 10 as a stopper. The conductive material 20a other than a portion thereof formed in the processing hole 72 is removed by the planarizing treatment, which results in that the conducting portion 20 is formed. As a result, the semiconductor device 1 as shown in FIG. 10 is obtained through the processes for forming the semiconductor device according to the second embodiment.

Third Embodiment

Figure 11:
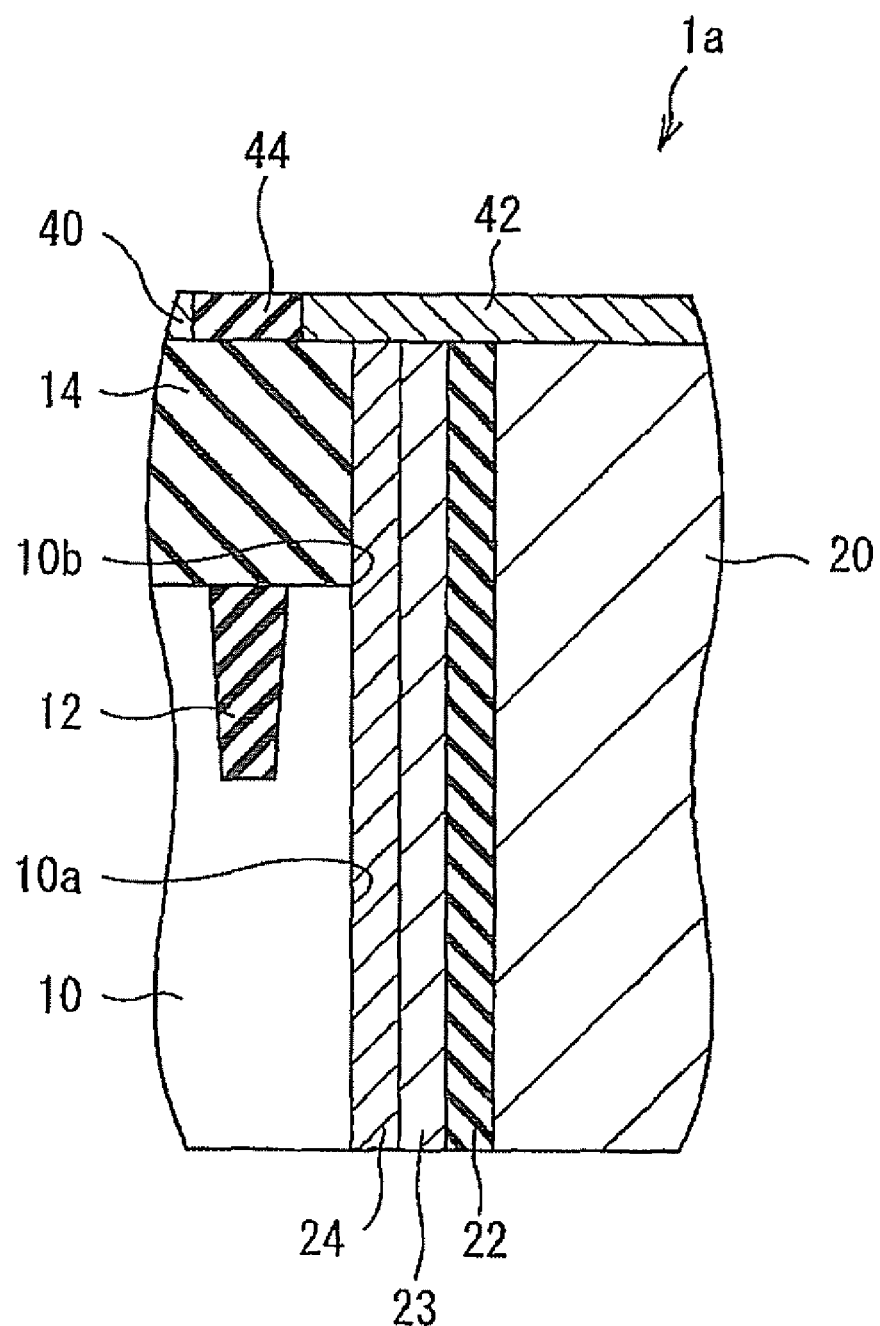
FIG. 11 is a cross sectional view showing a semiconductor device according to a third embodiment.

FIG. 11 shows an example of a cross sectional view of a semiconductor device according to a third embodiment.

A semiconductor device 1a according to the third embodiment has the substantially same configuration as the semiconductor device 1 according to the first embodiment, except that an interlayer 23 is further provided between the buffer layer 24 and the insulating layer 22. Therefore, detailed explanations will be omitted except for the difference.

The semiconductor device 1a according to the third embodiment further includes an interlayer 23 which is formed between the buffer layer 24 and the insulating layer 22 and is made of an insulating material or a conductive material having a predetermined thermal expansion coefficient. The interlayer 23 is made of a material in which a difference in thermal expansion coefficient between the buffer layer 24 and the interlayer 23 is smaller than that between the buffer layer 24 and the insulating layer 22. Concretely, the interlayer 23 is made of a material having a thermal expansion coefficient closer to that of the buffer layer 24 than that of the insulating layer 22.

For example, when the buffer layer 24 is made of C (thermal expansion coefficient of 3.1 ppm/° C.) and the insulating layer 22 is made of $SiO_2$ (thermal expansion coefficient of 0.5 ppm/° C.), the interlayer 23 can be made of silicon nitride (thermal expansion coefficient of about 4 ppm/° C.) or tungsten carbide (thermal expansion coefficient of 3.7 ppm/° C.), etc. Note that, in a modification of third embodiment, the interlayer 23 can be formed of plural layers having thermal expansion coefficients different from each other, for example, the interlayer 23 can be formed having a laminated structure in which the thermal expansion coefficient gradually changes from the buffer layer 24 side toward the insulating layer 22 side.

For example, the interlayer 23 can be formed including a laminated structure in which n layers of thin interlayers are laminated from first through $n^{th}$ thin interlayers (note: n is a positive integer number of 2 or more) from the buffer layer 24 side toward the insulating layer 22 side. In addition, the laminated structure can be formed so that a thermal expansion coefficient of each thin interlayer gradually differs from that of the substrate 10 from the first thin interlayer toward the $n^{th}$ thin interlayer.

Fourth Embodiment

Figure 12:
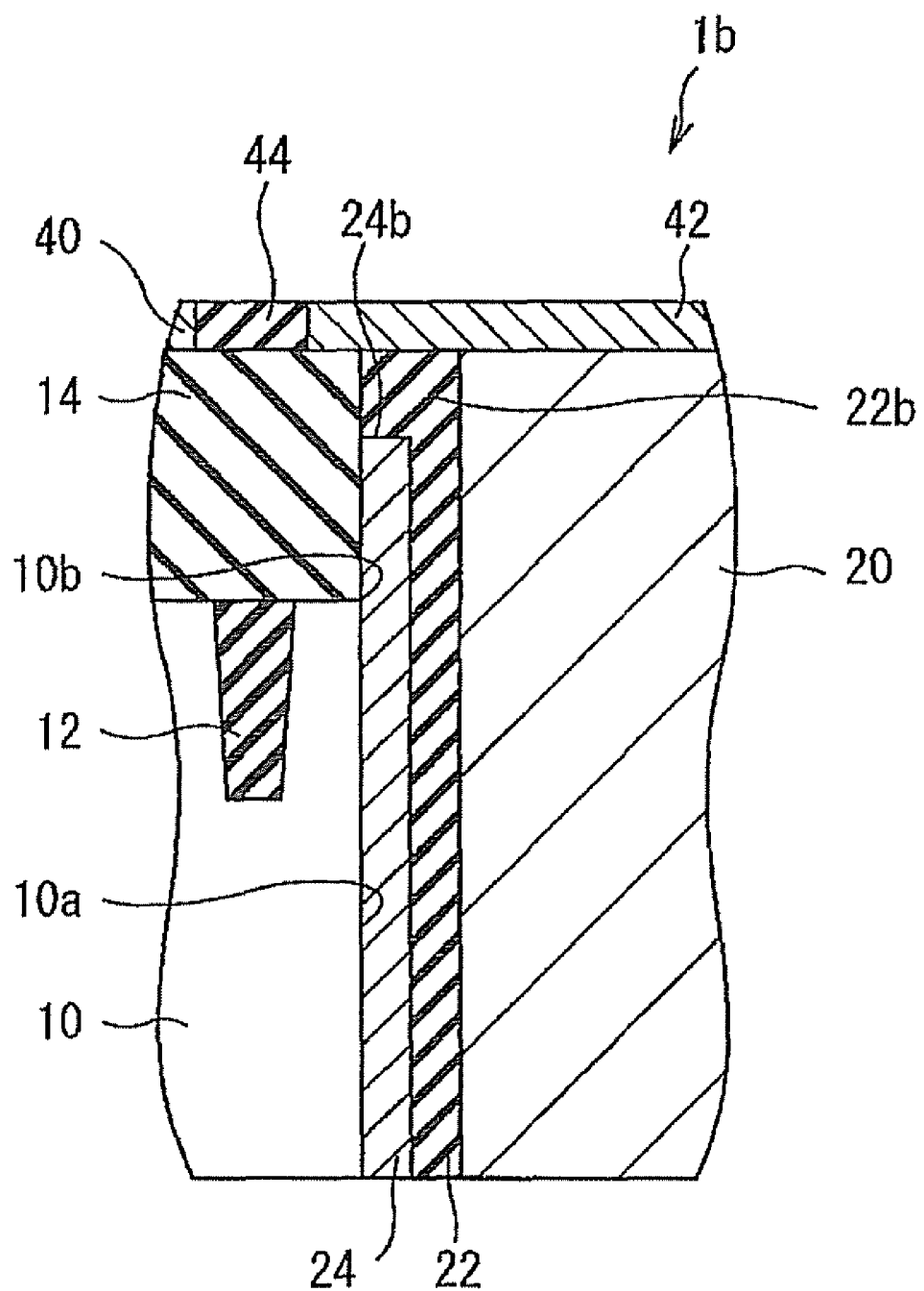
FIG. 12 is a cross sectional view showing a semiconductor device according to a fourth embodiment.

FIG. 12 shows an example of a cross sectional view of a semiconductor device according to a fourth embodiment.

A semiconductor device 1b according to the fourth embodiment has the substantially same configuration as the semiconductor device 1 according to the first embodiment, except that the buffer layer 24 does not contact with the wiring 42. Therefore, detailed explanations will be omitted except for the difference.

The semiconductor device 1b according to the fourth embodiment is formed having a segregation region 22b having a substantially L-shaped cross-section at an end of the insulating layer 22 on the wiring 42 side. In other words, an end 24b of the buffer layer 24 in the semiconductor device 1b is insulated from the wiring 42 by the segregation region 22b. As a result, when the buffer layer 24 is made of a conductive material such as C, etc., it is possible to prevent the buffer layer 24 from electrically conducting with the wiring 42.

Fifth Embodiment

Figure 13:
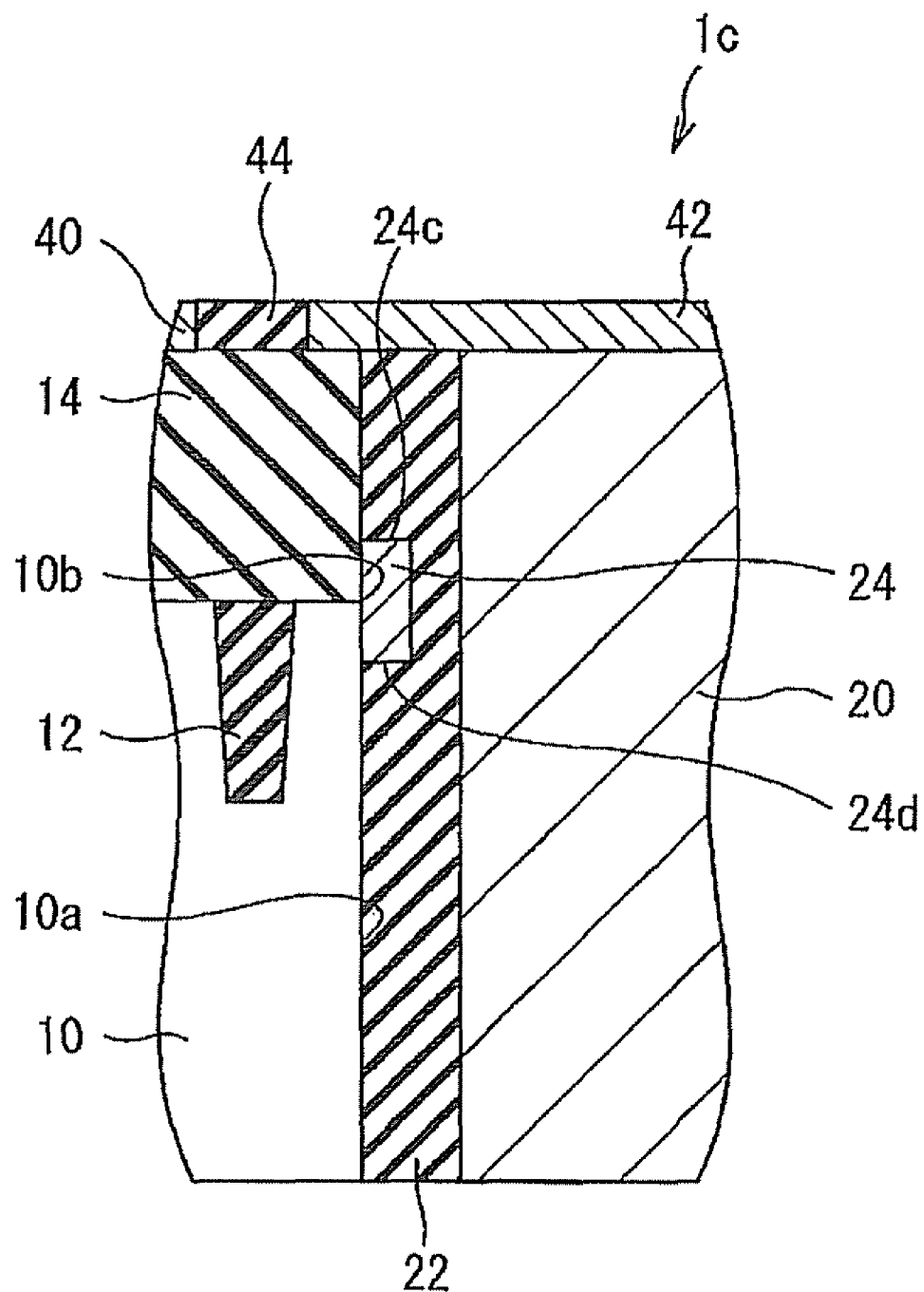
FIG. 13 is a cross sectional view showing a semiconductor device according to a fifth embodiment.

FIG. 13 shows an example of a cross sectional view of a semiconductor device according to a fifth embodiment.

A semiconductor device 1c according to the fifth embodiment has the substantially same configuration as the semiconductor device 1 according to the first embodiment, except that a region where the buffer layer 24 is formed is different. Therefore, detailed explanations will be omitted except for the difference.

In the semiconductor device 1c according to the fifth embodiment, the buffer layer 24 is formed only in a predetermined region including the boundary edge 10b. Concretely, the buffer layer 24 is provided in contact with the boundary edge 10b such that both of ends 24c and 24d contact with the insulating layer 22. This is because, when predetermined heat is applied to the semiconductor device 1c, a stress generated by a difference between the thermal expansion coefficient of the substrate 10 and that of the insulating layer 22 is likely to be concentrated at the boundary edge 10b between the substrate 10 and the interlayer insulating film 14 (or the etching stop layer as a surface layer). In other words, it is possible to reduce the stress generated in the substrate 10 by partially providing the buffer layer 24 in a region between the substrate 10, the interlayer insulating film 14 and the insulating layer 22, which is a predetermined region including the boundary edge 10b.

Although the embodiments have been described, the above-mentioned embodiments do not limit the invention according to the scope of claims. In addition, all combinations of characteristics explained in the embodiments are not necessarily essential for solving the problem of the present invention.

What is claimed is:

1. A method of fabricating a semiconductor device, comprising:
   forming a via hole in a portion of a substrate adjacent to an element region, the substrate having the element region where a semiconductor element is formed;
   forming a buffer layer on a sidewall of the via hole;
   forming an insulating layer on the buffer layer opposite to the sidewall; and
   filling a hole of the insulating layer opposite to the buffer layer side with a conductive material,
   wherein the buffer layer is formed of a material in that a difference in thermal expansion coefficient between the substrate and the buffer layer is smaller than that between the substrate and the insulating layer.

2. The method of fabricating a semiconductor device according to claim 1, wherein the buffer layer is formed a material having a thermal expansion coefficient closer to that of the substrate than that of the insulating layer.

3. The method of fabricating a semiconductor device according to claim 1, wherein the buffer layer is formed of a material containing at least one selected from a group consisting of carbon, silicon nitride, polyimide and tungsten carbide.

4. The method of fabricating a semiconductor device according to claim 1, wherein the substrate comprising silicon, silicon germanium or silicon carbide is used in the process of forming the via hole.

5. The method of fabricating a semiconductor device according to claim 1, further comprising:
   forming the semiconductor element formed having a gate electrode formed on the surface of the substrate via a gate insulating film, gate sidewalls formed on both side faces of the gate insulating film and the gate electrode, and source/drain regions formed in the substrate from portions immediately under the gate sidewalls.

6. The method of fabricating a semiconductor device according to claim 1, further comprising:
   forming an interlayer between the buffer layer and the insulating layer,
   wherein the interlayer is formed of a material in that a difference in thermal expansion coefficient between the buffer layer and the interlayer is smaller than that between the buffer layer and the insulating layer.

7. The method of fabricating a semiconductor device according to claim 6, wherein the buffer layer comprises carbon;
   the insulating layer comprises silicon dioxide; and
   the interlayer comprises silicon nitride or tungsten carbide.

8. The method of fabricating a semiconductor device according to claim 1, wherein copper, aluminum, tungsten or silicon is used as the conductive material in the process of filling the conductive material.

9. The method of fabricating a semiconductor device according to claim 1, wherein the via hole is formed by etching.

10. A method of fabricating a semiconductor device, comprising:

forming a processing hole in a portion of a substrate adjacent to an element region, the substrate having the element region where a semiconductor element is formed;

forming a buffer layer on a sidewall of the processing hole;

forming an insulating layer on the buffer layer opposite to the sidewall; and filling a hole of the insulating layer opposite to the buffer layer side with a conductive material, wherein the buffer layer is formed of a material in that a difference in thermal expansion coefficient between the substrate and the buffer layer is smaller than that between the substrate and the insulating layer.

* * * * *